(12) United States Patent
Zhao et al.

(10) Patent No.: US 10,826,242 B2
(45) Date of Patent: Nov. 3, 2020

(54) CARD TRAY HAVING INSULATIVE LATCHING PROTRUSION AND METALLIC REINFORCING PORTION EMBEDDED IN THE PROTRUSION

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Jun Zhao, Huaian (CN); Cai-Yun Zhang, Huaian (CN)

(73) Assignees: FOXCONN (KUNSHAN) COMPUTER CONNECTOR CO., LTD., Kunshan (CN); FOXCONN INTERCONNECT TECHNOLOGY LIMMITED, Grand Cayman (KY)

( * ) Notice: Subject to any disclaimer, the term of this patent is extended or adjusted under 35 U.S.C. 154(b) by 0 days.

(21) Appl. No.: 16/553,201

(22) Filed: Aug. 28, 2019

(65) Prior Publication Data
US 2020/0076130 A1    Mar. 5, 2020

(30) Foreign Application Priority Data
Aug. 30, 2018   (CN) .......................... 2018 1 1002486

(51) Int. Cl.
| H01R 13/639 | (2006.01) |
| G06K 13/07 | (2006.01) |
| H04B 1/3816 | (2015.01) |
| H05K 5/02 | (2006.01) |

(52) U.S. Cl.
CPC ........... *H01R 13/639* (2013.01); *G06K 13/07* (2013.01); *H04B 1/3816* (2013.01); *H05K 5/0286* (2013.01)

(58) Field of Classification Search
None
See application file for complete search history.

(56) References Cited

U.S. PATENT DOCUMENTS

| 8,439,696 B2 | 5/2013 | Zhou et al. |
| 9,445,521 B2 | 9/2016 | Tan et al. |
| 9,893,483 B2 | 2/2018 | Chen et al. |
| 2012/0220146 A1 | 8/2012 | Yokoyama et al. |
| 2016/0028172 A1 | 1/2016 | Motohashi et al. |
| 2017/0172004 A1* | 6/2017 | Yang ..................... H05K 5/0286 |

FOREIGN PATENT DOCUMENTS

TW    M483573 U    8/2014

* cited by examiner

*Primary Examiner* — Ross N Gushi
(74) *Attorney, Agent, or Firm* — Wei Te Chung; Ming Chieh Chang

(57) ABSTRACT

A card tray includes: an insulative frame having a side recess and a protrusion in front of the side recess; and a metallic plate molded with the insulative frame, the metallic plate having a reinforcing portion embedded in the insulative frame; wherein the protrusion has an end face at a lateral side thereof, and the reinforcing portion has an upper and lower edges buried in the protrusion and an exposed end face flush with the end face of the protrusion.

20 Claims, 7 Drawing Sheets

CARD TRAY HAVING INSULATIVE LATCHING PROTRUSION AND METALLIC REINFORCING PORTION EMBEDDED IN THE PROTRUSION

BACKGROUND OF THE INVENTION

1. Field of the Invention

The present invention relates to a card tray including insert molded insulative frame and metallic plate so structured and arranged that latching protrusions thereof are protected from being damaged.

2. Description of Related Arts

Taiwan Patent No. M483573 discloses a card tray including an insulative frame having a side recess and a metallic plate molded with the insulative frame, wherein the metallic plate has a latching protrusion exposed to the side recess.

SUMMARY OF THE INVENTION

A card tray comprises an insulative frame having a side recess and a protrusion in front of the side recess; and a metallic plate molded with the insulative frame, the metallic plate having a reinforcing portion embedded in the insulative frame, wherein the protrusion has an end face at a lateral side thereof, and the reinforcing portion has an upper and lower edges buried in the protrusion and an exposed end face flush with the end face of the protrusion.

DETAILED DESCRIPTION OF THE PREFERRED EMBODIMENT

Figure 1:
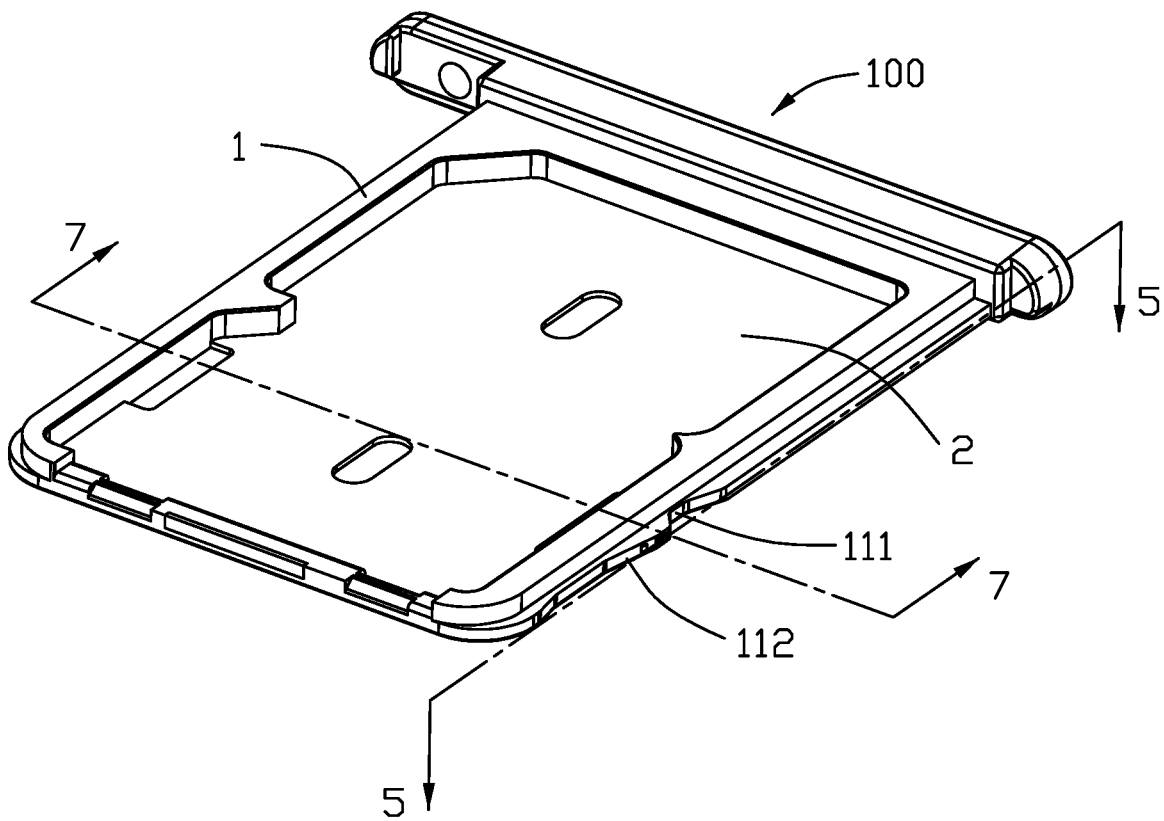
FIG. 1 is a perspective view of a card tray in accordance with the present invention.
Figure 2:
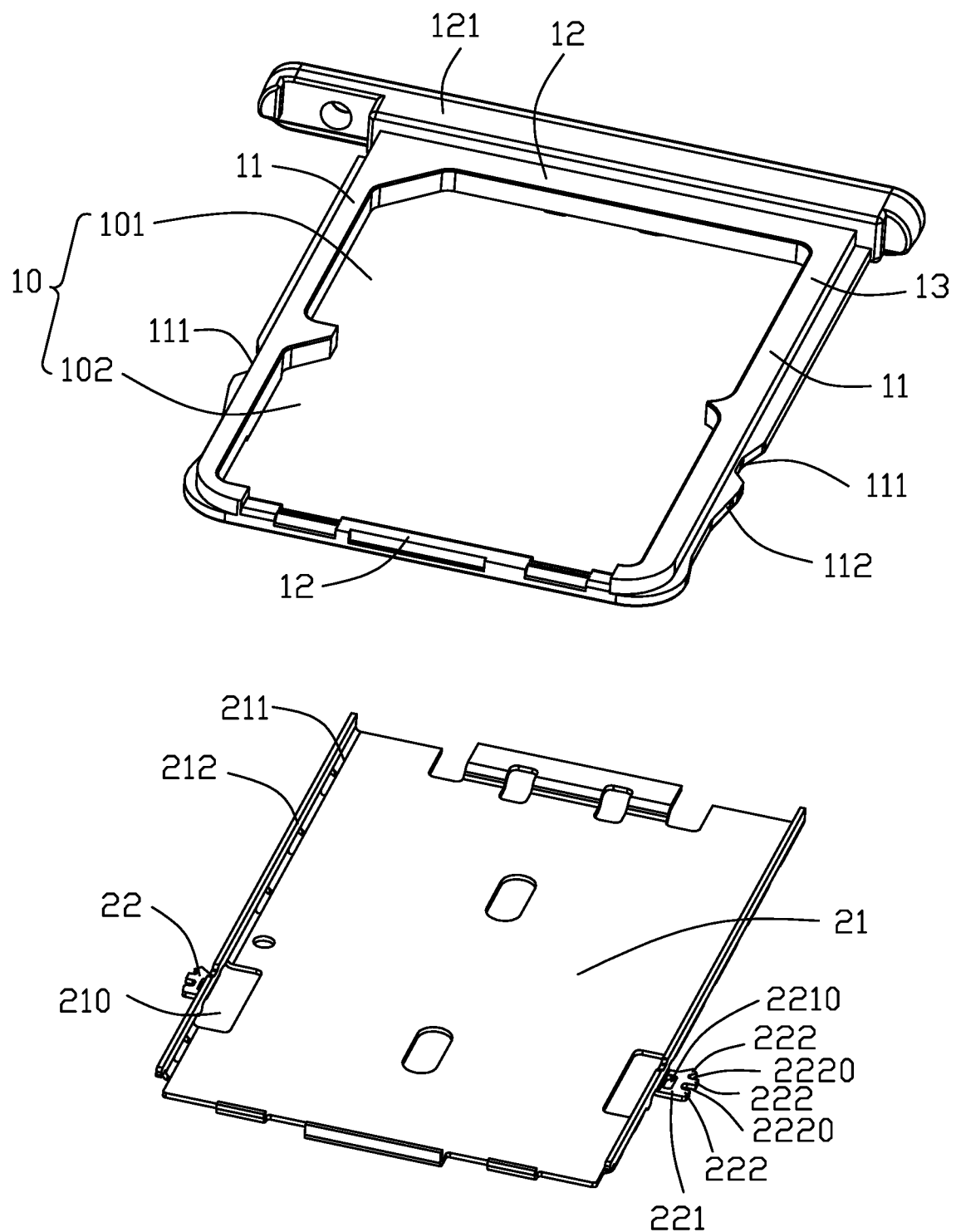
FIG. 2 is an exploded view of the card tray.
Figure 3:
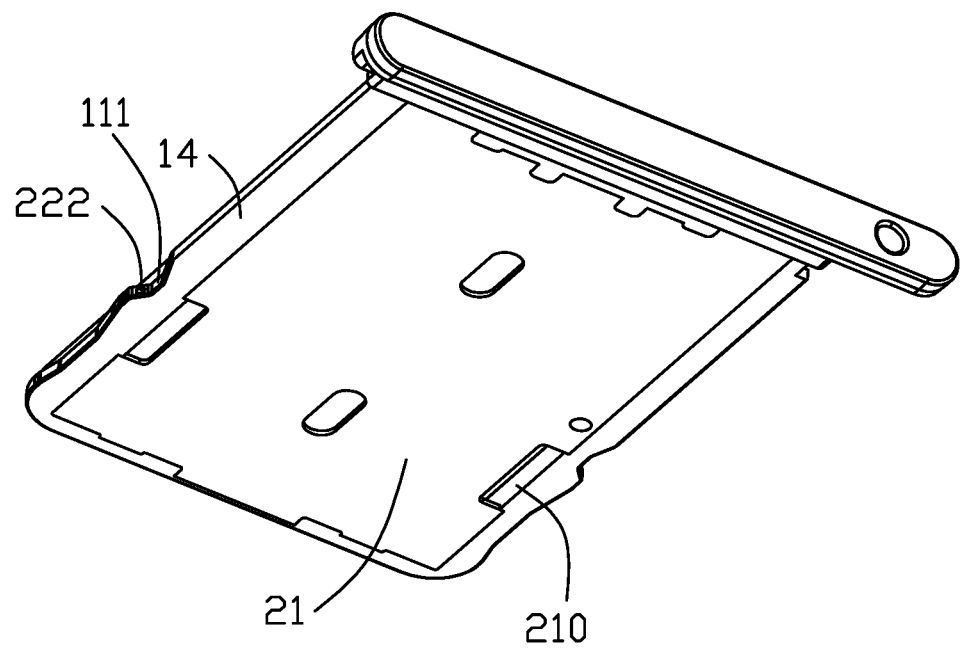
FIG. 3 is another perspective view of the card tray.
Figure 4:
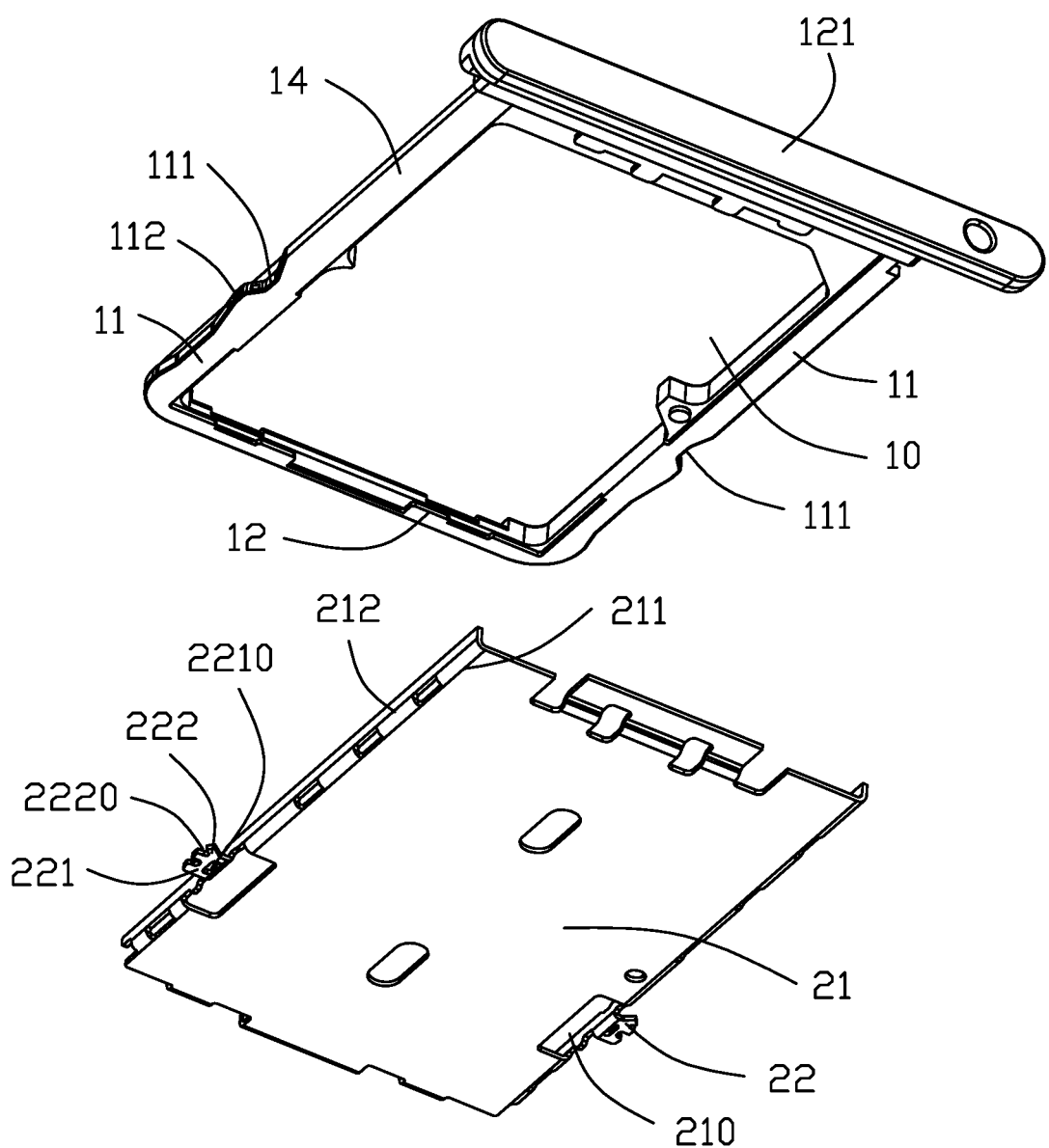
FIG. 4 is another exploded view of the card tray.
Figure 5:
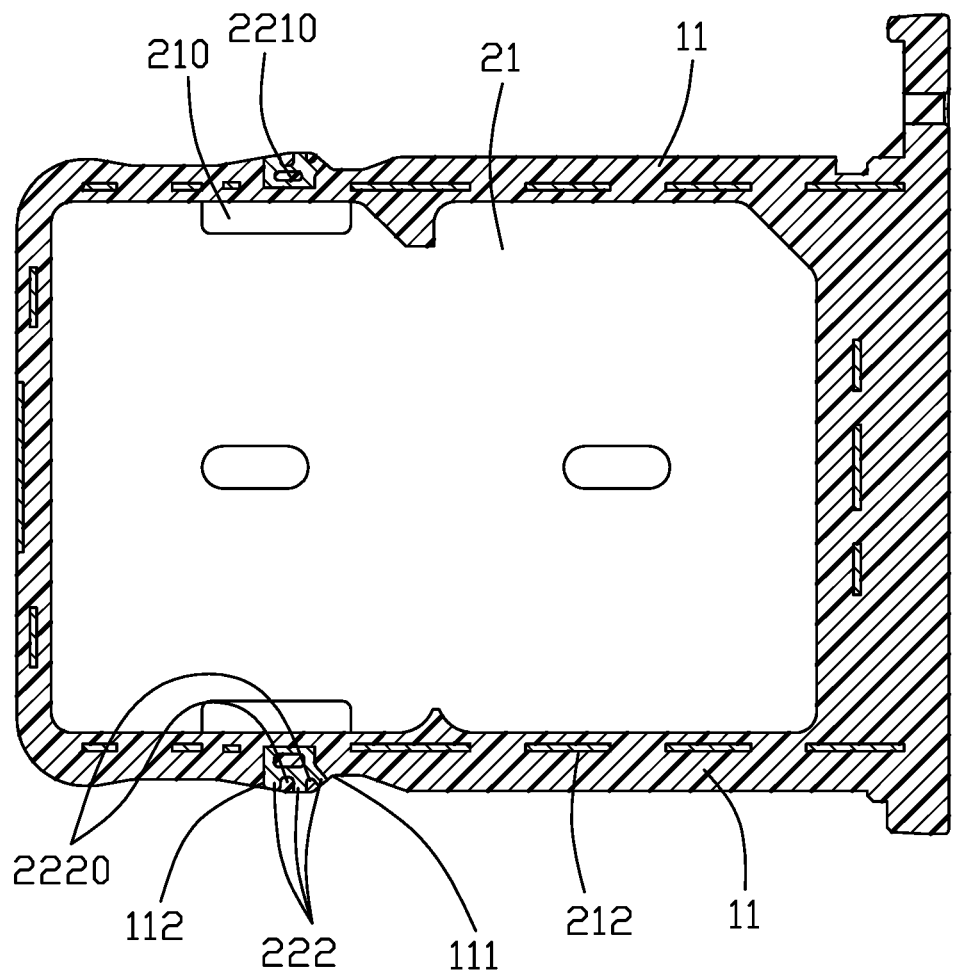
FIG. 5 is a cross-sectional view of the card tray taken along line 5-5 in FIG. 1.
Figure 6:
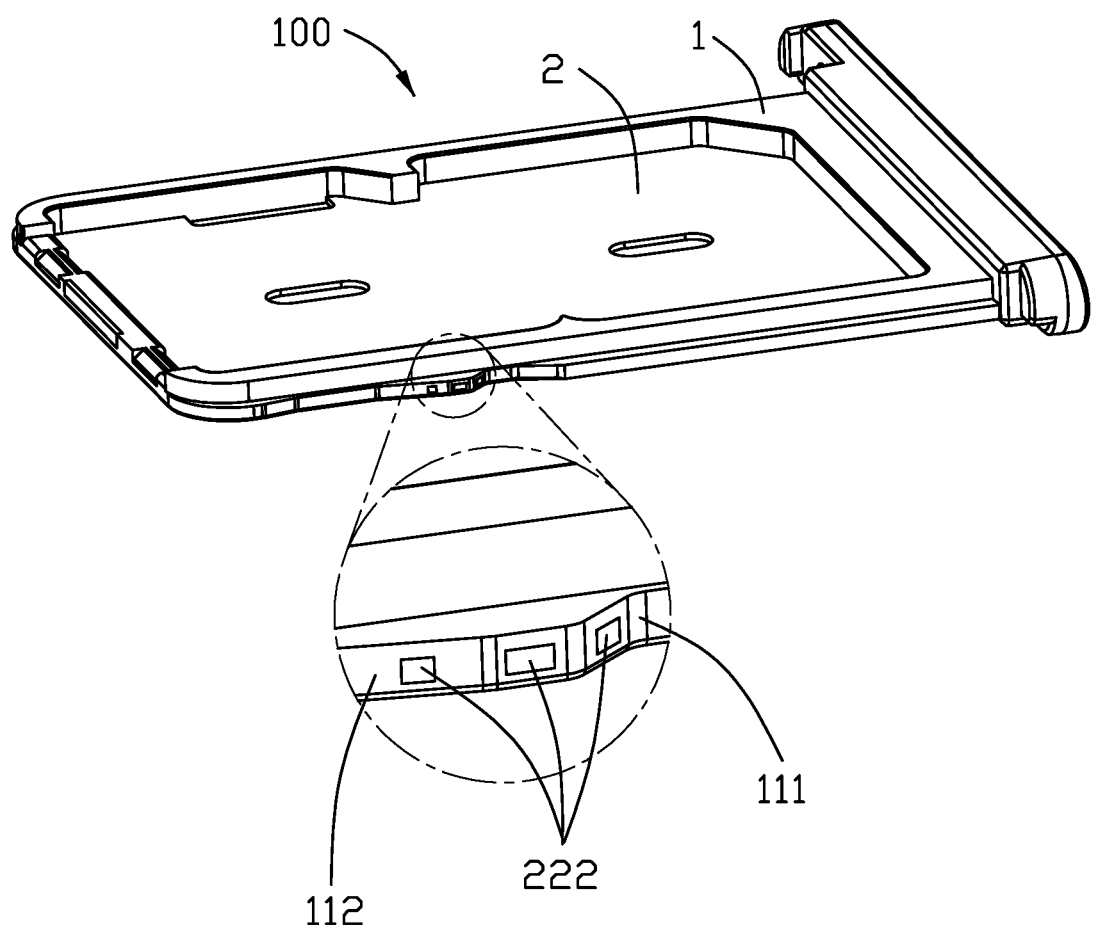
FIG. 6 is a side view of the card tray to show the metallic buried fingers are hidden in the insulative frame along the vertical direction.

Referring to FIGS. 1-7, a card tray 100 for removably inserting into a receiving space of an electrical connector comprises: an insulative frame 1 having a card receiving cavity 10; and a metallic plate 2 molded with the insulative frame 1. The card receiving cavity 10 includes a first part 101 for accommodating a first electronic card and a second part 102 for accommodating a second electronic card. The electronic card may be a SIM (Subscriber Identity Module) card.

The insulative frame 1 includes a pair of side beams 11 and a front and rear beams 12 and has a top and bottom faces 13 and 14. The rear beam 12 has a face plate 121. The side beam 11 has a recess 111 for engaging a corresponding latch of the electrical connector and a protrusion 112 in front of the recess 111. The metallic plate 2 includes a main part 21 and a pair of reinforcing portions 22 embedded in the side beams 11 of the insulative frame 1. The protrusion 112 has an end face at a lateral side thereof. The reinforcing portion 22 extending parallel to has an upper and lower edges buried in the protrusion 112 and an exposed end face flush with the end face of the protrusion 112. The reinforcing portion 22 includes a base 221 and three fingers 222 divided by slots 2220. The base 221 has a hole 2210. All the slots 2220 and the hole 2210 are filled by plastic materials during molding. The buried fingers 222 with only end faces thereof exposed to outside not only strengthen the protrusion 112 but also make the combined structure of the fingers 222 and the protrusion 112 sturdy and durable, compared with the mere blade type reinforcing portion.

Figure 7:
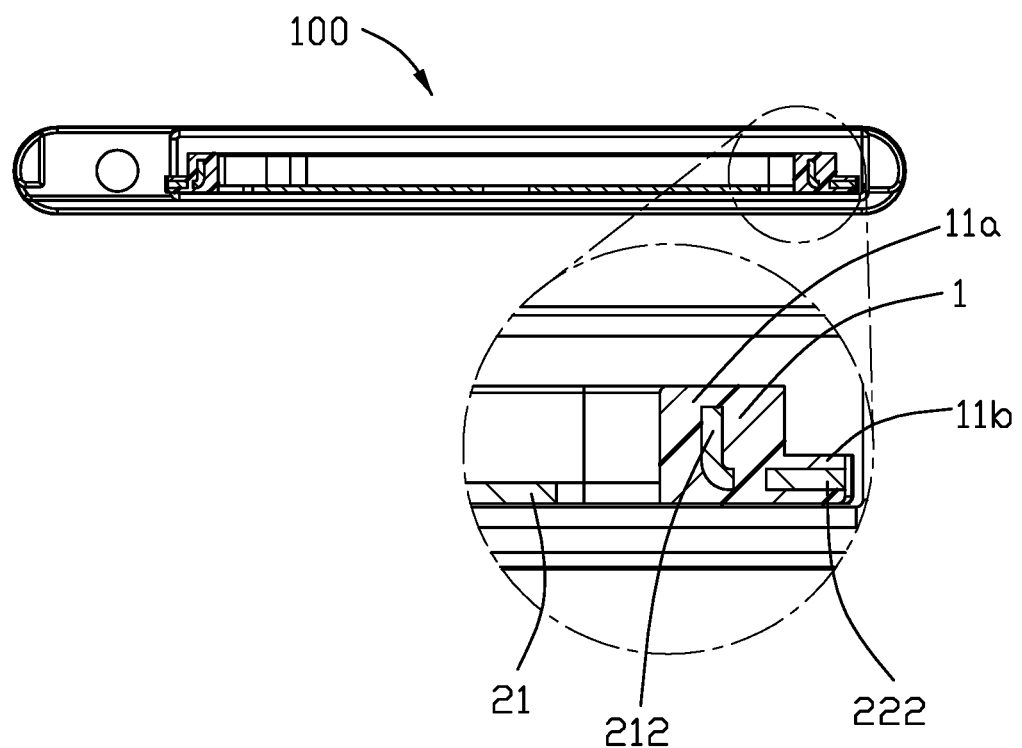
FIG. 7 is a cross-sectional view of the card tray taken along line 7-7 in FIG. 1.

The metallic plate has a pair of side walls 212 bent at edges 211 of a horizontal plate (not labeled) and the reinforcing portion 22 integrally extends from a bottom of the side wall 212, by suitable machining operations such as punching and bending, to leave an opening 210. Therefore, the dimension of the opening 210 in the transverse direction is not less than that of the reinforcing portion 22. The reinforcing portion 22 extends horizontally parallel to the horizontal plate in an offset higher level in the vertical direction, as shown in FIG. 7. Notably, the side beam 11 has an inner thick section 11a and an outer thin section 11b wherein the recess 111 and the protrusion 112 extending in the horizontal plane, are both located in the outer thin section 11b while the side wall 212 extending in the vertical plane, is located in the inner thick section 11a.

What is claimed is:

1. A card tray comprising:
   an insulative frame having a side recess and a protrusion in front of the side recess; and
   a metallic plate molded with the insulative frame, the metallic plate having a reinforcing portion embedded in the insulative frame; wherein
   the protrusion has an end face at a lateral side thereof, and the reinforcing portion has an upper and lower edges buried in the protrusion and an exposed end face flush with the end face of the protrusion; and
   the reinforcing portion includes a base and a plurality of fingers.

2. The card tray as claimed in claim 1, wherein the metallic plate has a side wall and the reinforcing portion integrally extends from a bottom of the side wall.

3. The card tray as claimed in claim 1, wherein the metallic plate has a main part with a horizontal plate, and the side wall extends from an edge of the horizontal plate, and the reinforcing portion is essentially stamped and bent from the horizontal plate so as to leave an opening.

4. The card tray as claimed in claim 3, wherein an opening is formed in the horizontal plate adjacent to and corresponding to the reinforcing portion.

5. The card tray as claimed in claim 4, wherein the reinforcing portion extends parallel to the horizontal plate.

6. The card tray as claimed in claim 5, wherein the reinforcing portion is offset and away from the horizontal plate in a vertical direction perpendicular to the horizontal plate.

7. The card tray as claimed in claim 1, wherein the plurality of fingers has corresponding intervals filled with the insulative frame.

8. The card tray as claimed in claim 7, wherein there are at least two fingers, of which one has an end facing toward the side recess.

9. The card tray as claimed in claim 1, wherein the insulative frame has a side beam where the recess and the protrusion are located, and the side beam includes an inner thick section and an outer thin section.

10. The card tray as claimed in claim 9, wherein the metallic plate has a side wall extending in a vertical plane and embedded within the inner thick section while the reinforcing portion extending in a horizontal plane is embedded within the outer thin section.

11. A card tray comprising:
an insulative frame defining a cavity with aside in a transverse direction a pair of side beams each having an inner thick section and an outer thin section;
a unitary metallic plate having a horizontal plate to cover said cavity in a vertical direction perpendicular to the transverse direction, and a pair of side walls each extending in a vertical plane and embedded within the inner thick section, and a reinforcing portion extending in a horizontal plane and embedded within the outer thin section.

12. The card tray as claimed in claim 11, wherein the outer thin section forms a recess and a protrusion adjacent to the recess in a front-to-back direction perpendicular to both the transverse direction and the vertical direction.

13. The card tray as claimed in claim 12, wherein the reinforcing portion is embedded within the protrusion.

14. The card tray as claimed in claim 11, wherein the reinforcing portion is offset from and higher than the horizontal plate in the vertical direction.

15. The card tray as claimed in claim 11, wherein the reinforcing portion forms a plurality of divergent fingers with corresponding end faces outwardly and laterally exposed to an exterior.

16. The card tray as claimed in claim 15, wherein the end face of one finger is directed toward a recess formed in the corresponding side beam.

17. The card tray as claimed in claim 11, wherein the reinforcing portion extends from a bottom edge of the corresponding side wall and is stamped from the horizontal plate, thus forming an opening in the horizontal plate beside the corresponding side wall.

18. The card tray as claimed in claim 11, wherein said reinforcing portion is fully hidden from an exterior in the vertical direction.

19. The card tray as claimed in claim 11, wherein said reinforcing portion forms a through hole in the vertical direction to be filled with the side beam.

20. A card tray comprising:
an insulative frame having a side recess and a protrusion in front of the side recess; and
a metallic plate molded with the insulative frame, the metallic plate having a reinforcing portion embedded in the insulative frame; wherein
the protrusion has an end face at a lateral side thereof, and the reinforcing portion has an upper and lower edges buried in the protrusion and an exposed end face flush with the end face of the protrusion; and
the metallic plate has a side wall and the reinforcing portion integrally extends from a bottom of the side wall.

* * * * *